(12) United States Patent
Tonegawa

(10) Patent No.: US 10,388,511 B2
(45) Date of Patent: Aug. 20, 2019

(54) METHOD OF FORMING SILICON NITRIDE FILM, FILM FORMING APPARATUS AND STORAGE MEDIUM

(71) Applicant: TOKYO ELECTRON LIMITED, Tokyo (JP)

(72) Inventor: Yamato Tonegawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/977,480

(22) Filed: May 11, 2018

(65) Prior Publication Data
US 2018/0342385 A1    Nov. 29, 2018

(30) Foreign Application Priority Data

May 24, 2017    (JP) .................................. 2017-103006

(51) Int. Cl.
| | | |
|---|---|---|
| *H01L 21/02* | (2006.01) | |
| *C23C 16/34* | (2006.01) | |
| *H01L 21/033* | (2006.01) | |
| *H01L 21/28* | (2006.01) | |

(52) U.S. Cl.
CPC ........ *H01L 21/0217* (2013.01); *C23C 16/345* (2013.01); *H01L 21/0228* (2013.01); *H01L 21/02211* (2013.01); *H01L 21/02274* (2013.01); *H01L 21/0337* (2013.01); *H01L 21/28194* (2013.01)

(58) Field of Classification Search
CPC ........... H01L 21/0217; H01L 21/02211; H01L 21/28914; H01L 21/02274; H01L 21/0337
See application file for complete search history.

(56) References Cited

U.S. PATENT DOCUMENTS

2014/0106577 A1*  4/2014  Tonegawa ......... H01L 21/02211
438/791
2015/0275368 A1* 10/2015  Motoyama .......... C23C 16/4412
118/728

FOREIGN PATENT DOCUMENTS

JP    2004-281853 A    10/2004
JP    2014-11357 A     1/2014

* cited by examiner

*Primary Examiner* — Mounir S Amer
(74) *Attorney, Agent, or Firm* — Nath, Goldberg & Meyer; Jerald L. Meyer

(57) ABSTRACT

There is provided a method of forming a silicon nitride film including: arranging substrates in a process vessel; and forming a silicon nitride film on the substrates in a batch by repeating a cycle including: a first purge step of purging the process vessel while heating the process vessel and making an interior of the process vessel be in a predetermined depressurized state; a film-forming raw material gas adsorbing step of adsorbing a chlorine-containing silicon compound to the substrates by supplying a film-forming raw material gas composed of the chlorine-containing silicon compound into the process vessel; a second purge step of purging the process vessel; and a nitriding step of nitriding the substrates by supplying a nitriding gas into the process vessel, and wherein in each of the cycle, a hydrogen radical purge step is performed between the film-forming raw material gas adsorbing step and the nitriding step.

13 Claims, 11 Drawing Sheets

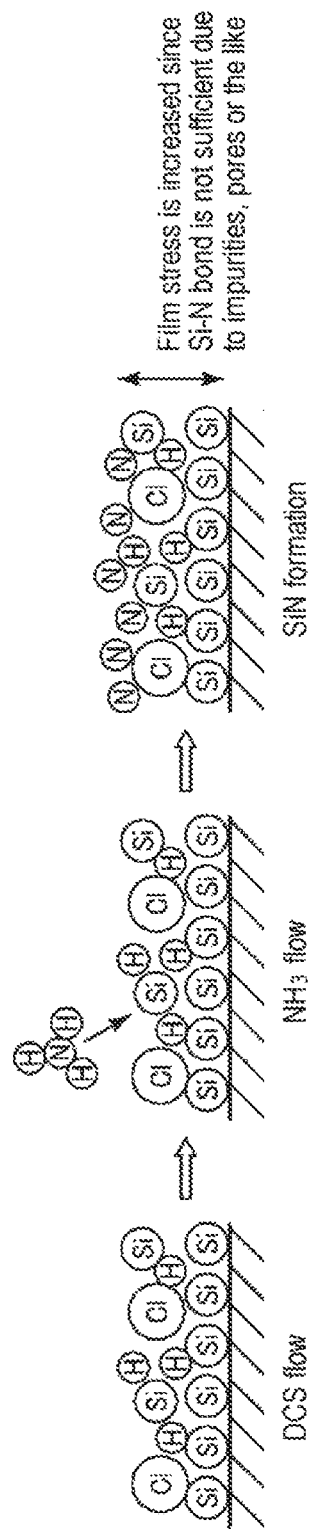

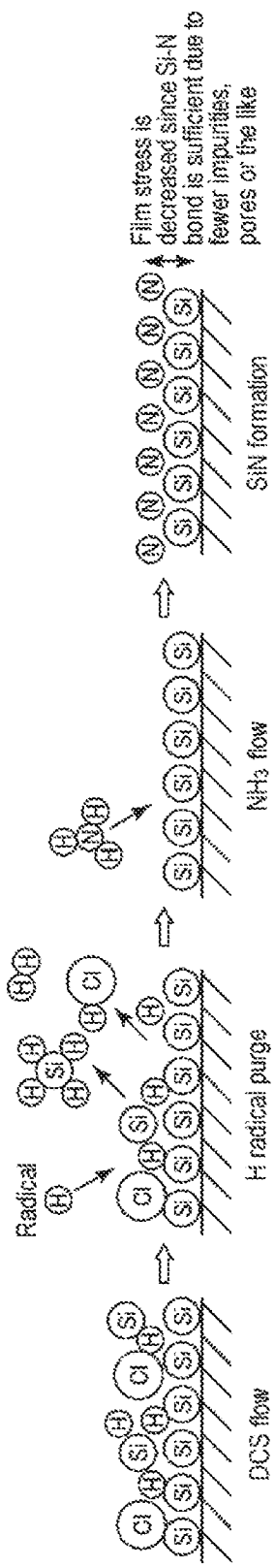

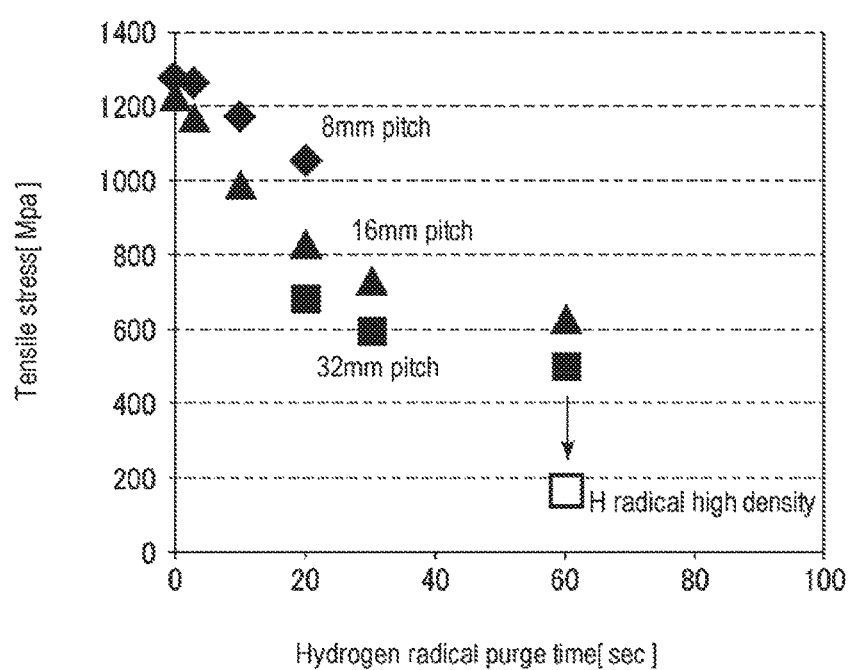

METHOD OF FORMING SILICON NITRIDE FILM, FILM FORMING APPARATUS AND STORAGE MEDIUM

CROSS-REFERENCE TO RELATED APPLICATION

This application is based upon and claims the benefit of priority from Japanese Patent Application No. 2017-103006, filed on May 24, 2017, the entire contents of which are incorporated herein by reference.

TECHNICAL FIELD

The present disclosure relates to a method of forming a silicon nitride film, a film forming apparatus and a non-transitory computer-readable storage medium.

BACKGROUND

In a manufacturing sequence of a semiconductor device, there is performed a film forming process of forming a nitride film such as a silicon nitride film (SiN film) as an insulating film on a semiconductor wafer (substrate) represented by a silicon wafer.

Conventionally, plasma chemical vapor deposition (CVD) has been widely used as a method of forming an SiN film. Meanwhile, an SiN film by an atomic layer deposition (ALD) method which can form a film at a low temperature and with uniform and good coverage and which has good electric characteristics is also used. As a method of forming an SiN film by the ALD method, conventionally, it is known that a dichlorosilane (DCS) gas as an Si raw material gas and an $NH_3$ gas as a nitriding gas are alternately and repeatedly supplied with a purge process interposed between the supply of the DCS gas and the supply of $NH_3$ gas to form an SiN film, in a batch-type vertical film forming apparatus capable of processing a plurality of semiconductor wafers in a batch.

When forming an SiN film by the ALD method using the batch-type vertical film forming apparatus, a process of firstly supplying a dichlorosilane (DCS; $SiH_2Cl_2$) gas to a semiconductor wafer as a substrate using, for example, the DCS gas as a raw material gas and an $NH_3$ gas as a nitriding gas to chemically adsorb Si of a single atomic layer, a process of purging the DCS gas with an inert gas, a process of supplying plasma of the $NH_3$ gas to nitrify the adsorbed Si, and a process of purging the $NH_3$ gas with an inert gas are performed such that an SiN unit film having one molecular layer thickness is formed under predetermined film forming conditions. The processes are repeated by a predetermined number of times, to obtain an SiN film having a predetermined film thickness.

As an application of the SiN film, there may be a sidewall (spacer) in a double patterning technique capable of obtaining a fine pattern less than the resolution limit of photolithography technique. In the aforementioned double patterning technique, an SiN film is formed on an amorphous silicon pattern and then etched so that the spacer (SiN spacer) of the SiN film remains only on a sidewall portion of the amorphous silicon pattern. Thereafter, the amorphous silicon pattern is removed to form a pattern of the SiN film.

In such double patterning, according to further miniaturization of a pattern, the SiN spacer is required to have very severe uniformity and low temperature film formation, and high coverage performance or the like is also required. Therefore, the SiN film by the aforementioned ALD method has been studied.

However, the SiN film generally has high tensile stress, and bending due to the attraction between spacers is becoming a problem as the SiN spacer becomes thinner according to miniaturization of a device.

The SiN film by the plasma CVD method can adjust the stress in the film by adjusting the hydrogen concentration or composition in the film by a gas ratio, a pressure, or the like.

However, the SiN film formed by the ALD method is very dense and has fewer impurities than impurities in the SiN film formed by the plasma CVD method, and it was difficult to control the stress in the film in the required low temperature film formation. Such a stress problem in the film occurs not only in the double patterning spacer but also in the SiN film by the ALD method.

SUMMARY

The present disclosure provides some embodiments of a technique capable of reducing stress of a silicon nitride film as formed, in forming a silicon nitride film on a plurality of target substrates by an ALD method.

According to one embodiment of the present disclosure, there is provided a method of forming a silicon nitride film including: arranging a plurality of target substrates in a process vessel; and forming a silicon nitride film having a predetermined film thickness on the plurality of target substrates in a batch by repeating, a plurality of times, a cycle including: a first purge step of purging an interior of the process vessel with an inert gas while heating the interior of the process vessel to a predetermined temperature and making the interior of the process vessel be in a predetermined depressurized state; a film-forming raw material gas adsorbing step of adsorbing a chlorine-containing silicon compound to the target substrates by supplying a film-forming raw material gas composed of the chlorine-containing silicon compound into the process vessel; a second purge step of purging the interior of the process vessel with an inert gas; and a nitriding step of nitriding an element constituting the target substrates by supplying a nitriding gas into the process vessel, and wherein in each of the cycle, a hydrogen radical purge step of performing a hydrogen radical purge by generating hydrogen radicals in the process vessel is performed between the film-forming raw material gas adsorbing step and the nitriding step to promote an Si—N bond of the silicon nitride film to be formed so as to reduce a tensile stress of the silicon nitride film to be formed.

According to another embodiment of the present disclosure, there is provided a film forming apparatus for forming a silicon nitride film having a predetermined film thickness on a plurality of target substrates in a batch, including: a process vessel configured to accommodate the plurality of target substrates on which the silicon nitride film is formed; a gas supply mechanism configured to supply an inert gas, a silicon film-forming raw material gas, a nitriding gas, and a hydrogen gas into the process vessel; a heating device configured to heat the plurality of target substrates accommodated in the process vessel; a hydrogen radical generating mechanism configured to generate hydrogen radicals; an exhaust device configured to exhaust an interior of the process vessel; and a controller configured to control so that the silicon nitride film having a predetermined film thickness is formed on the plurality of target substrates in a batch by repeating, a plurality of times, a cycle including: a first purge step of purging the interior of the process vessel with an inert gas while heating the interior of the process vessel to a predetermined temperature and making the interior of the process vessel be in a predetermined depressurized state; a film-forming raw material gas adsorbing step of adsorbing a chlorine-containing silicon compound to the target substrates by supplying a film-forming raw material gas composed of the chlorine-containing silicon compound into the process vessel; a second purge step of purging the interior of the process vessel with an inert gas; and a nitriding step of nitriding an element constituting the target substrates by supplying a nitriding gas into the process vessel, wherein, in each of the cycle, a hydrogen radical purge step of performing a hydrogen radical purge by generating hydrogen radicals in the process vessel by the hydrogen radical generating mechanism is performed between the film-forming raw material gas adsorbing step and the nitriding step to promote an Si—N bond of the silicon nitride film to be formed so as to reduce a tensile stress of the silicon nitride film to be formed.

According to yet another embodiment of the present disclosure, there is provided a non-transitory computer-readable storage medium storing a program that operates on a computer and controls an apparatus for forming a silicon nitride film, wherein the program, when executed, causes the computer to control the apparatus for forming a silicon nitride film to perform the method of forming a silicon nitride film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 8A and 8B are diagrams illustrating a mechanism of reducing stress in a film by hydrogen radical purge.

FIG. 10 is a diagram illustrating results of an experimental example.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the present embodiment, a case in which a silicon nitride film (SiN film) as a nitride film is formed will be described as an example.

<Example of Film Forming Apparatus>

Figure 1:
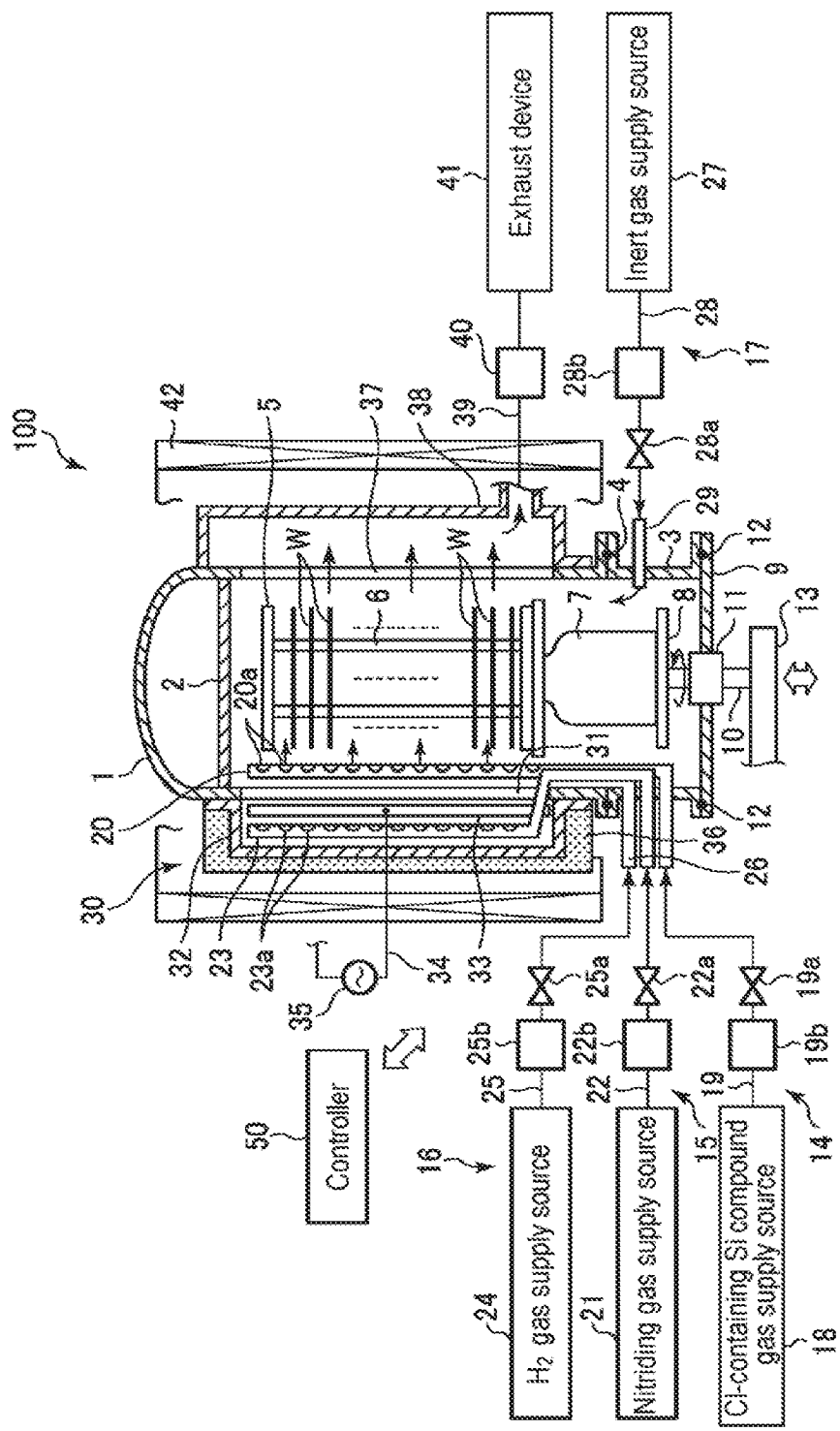
FIG. 1 is a vertical cross-sectional view illustrating an example of a film forming apparatus that can be used for performing a method of forming a nitride film according to one embodiment of the present disclosure.
Figure 2:
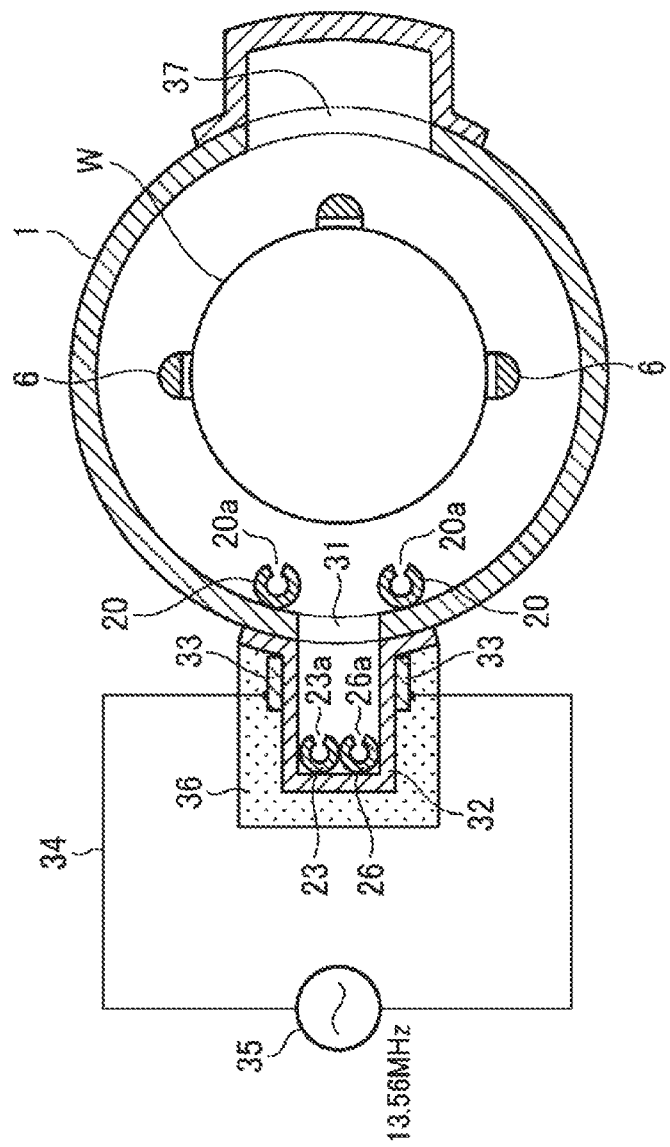
FIG. 2 is a horizontal cross-sectional view of the film forming apparatus illustrated in FIG. 1.

FIG. 1 is a vertical cross-sectional view illustrating an example of a film forming apparatus which can be used for performing a method of forming a nitride film according to one embodiment of the present disclosure. FIG. 2 is a horizontal cross-sectional view of the film forming apparatus illustrated in FIG. 1.

The film forming apparatus 100 of this example has a cylindrical process vessel 1 having a ceiling with its lower end opened. The entire process vessel 1 is made of, for example, quartz. A ceiling plate 2 made of quartz is installed around an upper end portion of an interior of the process vessel 1, and a region on a lower side of the ceiling plate 2 is sealed. In addition, a manifold 3 having a cylindrical shape and made of metal is connected to a lower end opening of the process vessel 1 through a seal member 4 such as an O-ring.

The manifold 3 supports the lower end of the process vessel 1. A wafer boat 5 made of quartz on which a plurality of wafers W, for example, 50 to 150 semiconductor wafers (silicon wafers), as target substrates, are stacked in multiple stages from a lower side of the manifold 3 is configured to be inserted into the process vessel 1. The wafer boat 5 has three rods 6 (see FIG. 2), and the plurality of wafers W are supported by grooves (not shown) formed in the rods 6.

The wafer boat 5 is loaded on a table 8 via a heat insulating tube 7 made of quartz. The table 8 is supported on a rotary shaft 10 which penetrates a lid member 9 made of metal (stainless steel) for opening and closing a lower end opening of the manifold 3.

In addition, a magnetic fluid seal 11 is installed in the penetrating portion of the rotary shaft 10 so as to rotatably support the rotary shaft 10 while air-tightly sealing it. Furthermore, a seal member 12 for maintaining sealability of the interior of the process vessel 1 is interposed between a peripheral portion of the lid member 9 and a lower end portion of the manifold 3.

The rotary shaft 10 is installed at a leading end of an arm 13 supported by an elevating mechanism (not shown) such as, for example, a boat elevator or the like. The wafer boat 5, the lid member 9 and the like are integrally moved up and down so as to be inserted and separated into and from the process vessel 1. Furthermore, the table 8 may be fixedly installed on the lid member 9 side such that the wafers W can be processed without rotating the wafer boat 5.

The film forming apparatus 100 further includes a Cl-containing Si compound gas supply mechanism 14 for supplying a Cl-containing Si compound gas, for example, a DCS gas, into the process vessel 1, a nitriding gas supply mechanism 15 for supplying a nitriding gas, for example, an $NH_3$ gas, into the process vessel 1, an $H_2$ gas supply mechanism 16 for supplying a hydrogen gas ($H_2$ gas) into the process vessel 1, and an inert gas supply mechanism 17 for supplying an inert gas, for example, an $N_2$ gas or an Ar gas, as a purge gas or the like into the process vessel 1.

The Cl-containing Si compound gas supply mechanism 14 has a Cl-containing Si compound gas supply source 18, a gas pipe 19 for guiding a Cl-containing Si compound gas from the Cl-containing Si compound gas supply source 18, and a gas dispersion nozzle 20 which is connected to the gas pipe 19 and guides the Cl-containing Si compound gas into the process vessel 1. The Cl-containing Si compound gas may include monochlorosilane (MCS; $SiH_3Cl$), trichlorosilane (TCS; $SiHCl_3$), silicon tetrachloride (STC; $SiCl_4$), hexachlorodisilane (HCD; $Si_2Cl_6$) and the like, in addition to the DCS gas.

The nitriding gas supply mechanism 15 has a nitriding gas supply source 21, a gas pipe 22 for guiding a nitriding gas from the nitriding gas supply source 21, and a gas dispersion nozzle 23 for guiding the nitriding gas into the process vessel 1. The nitriding gas may include an $N_2$ gas and the like, in addition to the $NH_3$ gas.

The $H_2$ gas supply mechanism 16 has an $H_2$ gas supply source 24, a gas pipe 25 for guiding an $H_2$ gas from the $H_2$ gas supply source 24, and a gas dispersion nozzle 26 for guiding the $H_2$ gas into the process vessel 1.

The gas dispersion nozzles 20, 23, and 26 are made of quartz. The gas dispersion nozzles 20, 23, and 26 penetrate a sidewall of the manifold 3 inward, are bent upward and extend vertically. A plurality of gas discharge holes 20a, 23a, and 26a (where 26a is illustrated only in FIG. 2) are formed in vertical portions of the gas dispersion nozzles 20, 23, and 26, respectively, at predetermined intervals corresponding to the respective wafers W along a length of the vertical direction corresponding to a wafer support range of the wafer boat 5. The gas can be discharged substantially uniformly from the respective gas discharge holes 20a, 23a, and 26a toward the process vessel 1 in the horizontal direction. As shown in FIG. 2, two gas dispersion nozzles 20 and respective one gas dispersion nozzles 23 and 26 are installed.

The inert gas supply mechanism 17 has an inert gas supply source 27, a gas pipe 28 for guiding an inert gas from the inert gas supply source 27, and a gas nozzle 29 which is connected to the gas pipe 28, installed so as to penetrate the sidewall of the manifold 3 and made of a short quartz tube.

Opening/closing valves 19a, 22a, 25a and 28a, and flow rate controllers 19b, 22b, 25b and 28b are installed in the gas pipes 19, 22, 25, and 28, respectively.

A plasma generating mechanism 30 is formed in a portion of a sidewall of the process vessel 1. The plasma generating mechanism 30 serves to plasmarize a nitriding gas such as an $NH_3$ gas or the like to generate active species for nitriding, and also serves to plasmarize an $H_2$ gas to generate hydrogen radicals.

The plasma generating mechanism 30 has a plasma partition wall 32 that is air-tightly welded to an outer wall of the process vessel 1. The plasma partition wall 32 is made of, for example, quartz. The plasma partition wall 32 has a recess-shaped cross section and covers an opening 31 formed on the sidewall of the process vessel 1. The opening 31 is vertically elongated so as to cover all the semiconductor wafers W supported by the wafer boat 5 in the vertical direction. The gas dispersion nozzle 23 for discharging a nitriding gas such as an $NH_3$ gas and the gas dispersion nozzle 26 for discharging an $H_2$ gas as described above are disposed in an inner space defined by the plasma partition wall 32, namely inside a plasma generation space. The two gas dispersion nozzles 20 for discharging a Cl-containing Si compound gas such as a DCS gas are installed at positions in which the opening 31 on the inner wall of the process vessel 1 is interposed between the two gas dispersion nozzles 20.

The plasma generating mechanism 30 further has a pair of elongated plasma electrodes 33 disposed on outer surfaces of both sidewalls of the plasma partition wall 32 so as to face each other along the vertical direction, and a high frequency power source 35 which is connected to each of the pair of plasma electrodes 33 via a power supply line 34 and supplies a high frequency power to the pair of plasma electrodes 33. The high frequency power source 35 applies a high frequency voltage of, for example, 13.56 MHz, to the pair of plasma electrodes 33. Therefore, a high frequency electric field is applied into the plasma generation space defined by the plasma partition wall 32. The nitriding gas discharged from the gas dispersion nozzle 23 and the $H_2$ gas discharged from the gas dispersion nozzle 26 are plasmarized in the plasma generation space into which the high frequency electric field is applied, and the active species and hydrogen radicals for nitriding generated thereby are supplied into the process vessel 1 via the opening 31.

An insulation protection cover 36 is installed outside of the plasma partition wall 32 so as to cover the insulation protection cover 36. A refrigerant passage (not shown) is installed in an inner portion of the insulation protection cover 36, and the plasma electrodes 33 are cooled by allowing a coolant such as a cooled nitrogen gas or the like to flow through the refrigerant passage.

An exhaust port 37 for vacuum-exhausting the interior of the process vessel 1 is installed in a sidewall portion of the process vessel 1 opposite the opening 31. The exhaust port 37 is vertically elongated so as to correspond to the wafer boat 5. An exhaust port cover member 38 formed to have a U-shaped cross section so as to cover the exhaust port 37 is installed in a portion corresponding to the exhaust port 37 of the process vessel 1. The exhaust port cover member 38 extends upward along the sidewall of the process vessel 1. An exhaust pipe 39 for exhausting the process vessel 1 through the exhaust port 37 is connected to a lower portion of the exhaust port cover member 38. A pressure control valve 40 for controlling the internal pressure of the process vessel 1 and an exhaust device 41 including a vacuum pump and the like are connected to the exhaust pipe 39 such that the interior of the process vessel 1 is exhausted by the exhaust device 41 via the exhaust pipe 39.

In addition, a cylindrical heating mechanism 42 for heating the process vessel 1 and the wafers W therein is installed so as to surround an outer periphery of the process vessel 1

The film forming apparatus 100 has a controller 50. The controller 50 performs controls of the respective components of the film forming apparatus 100, for example, the supply and stop of each gas by opening and closing the valves 19a, 22a, 25a, and 28a, the gas flow rate control by the flow rate controllers 19b, 22b, 25b, and 28b, the exhaust control by the exhaust device 41, the ON/OFF control of high frequency power by the high frequency power source 35, the temperature control of the wafers W by the heating mechanism 42, and the like. The controller 50 has a CPU (computer), and has a main controller that performs the aformentioned controls, an input device, an output device, a display device, and a storage device. In the storage device, a storage medium storing a program for controlling a process to be executed in the film forming apparatus 100, i.e., a process recipe, is set. The main controller reads out a predetermined process recipe stored in the storage medium and controls the film forming apparatus 100 so that a predetermined process is performed by the film forming apparatus 100 based on the process recipe.

<Film Forming Method>

Next, a film forming method according to one embodiment of the present disclosure performed by the film forming apparatus 100 will be described.

Here, an example in which an SiN film (ALD-SiN film) is formed by an ALD method using a DCS gas as a Cl-containing Si compound gas, an $NH_3$ gas as a nitriding gas, and an $N_2$ gas as a purge gas will be described.

First, a temperature of the interior of the process vessel 1 is set at 400 to 600 degrees C., the wafer boat 5 on which 50 to 150 wafers W are mounted is loaded into the process vessel 1, and an internal pressure of the process vessel 1 is adjusted to 13 to 665 Pa while exhausting the interior of the process vessel 1 by the exhaust device 41.

Figure 3:
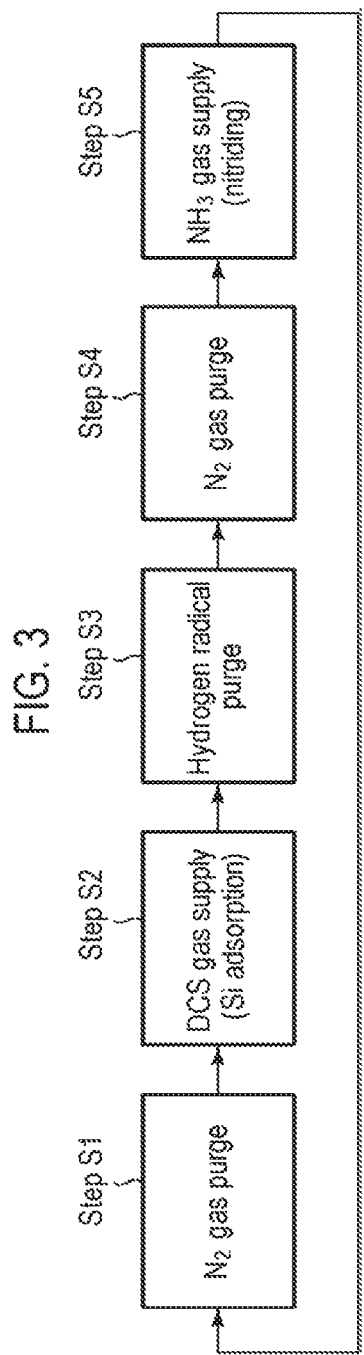
FIG. 3 is a diagram illustrating a sequence of the method of forming a nitride film according to one embodiment of the present disclosure.

In this state, as illustrated in a sequence diagram of FIG. 3, a purge step with an $N_2$ gas (step S1), a DCS gas supply (Si adsorption) step (step S2), a hydrogen radical purge step (step S3), a purge step with an $N_2$ gas (step S4), and an $NH_3$ gas supply (nitriding) step (step S5) are repeated a predetermined number of times to form an ALD-SiN film having a predetermined film thickness.

The purge steps of step S1 and step S4 are performed by supplying the $N_2$ gas as an inert gas from the inert gas supply source 27 into the process vessel 1 while exhausting the interior of the process vessel 1 by the exhaust device 41. Thus, the internal atmosphere of the process vessel 1 is substituted by the $N_2$ gas. The conditions at this time are preferably as follows: the $N_2$ gas flow rate: 500 to 5,000 sccm, the time period: 3 to 10 sec.

At the DCS gas supply step of step S2, a DCS gas is supplied as a Cl-containing Si compound gas from the Cl-containing Si compound gas supply source 18 into the process vessel 1 to adsorb Si to the surface of the wafers W. The conditions at this time are preferably as follows: the DCS gas flow rate: 500 to 3,000 sccm, the time period: 1 to 10 sec.

At the hydrogen radical purge step of step S3, an $H_2$ gas is supplied from the $H_2$ gas supply source 24 into the process vessel 1 while exhausting the interior of the process vessel 1, to generate hydrogen radicals by plasmarizing the $H_2$ gas by the plasma generating mechanism 30, and to allow the hydrogen radicals to act on the wafers W after step S2. Details of the hydrogen radical purge step of step S3 will be described later.

At the $NH_3$ gas supply step of step S5, an $NH_3$ gas is supplied as a nitriding gas from the nitriding gas supply source 21 into the process vessel 1 to generate active species for nitriding by plasmarizing the $NH_3$ gas by the plasma generating mechanism 30, and to nitride Si adsorbed at step S2. The conditions at this time are preferably as follows: the $NH_3$ gas flow rate: 500 to 5,000 sccm, the time period: 5 to 120 sec.

The order of the hydrogen radical purge step of step S3 and the purge step of step S4 may also be interchanged.

Next, the hydrogen radical purge step of step S3 will be described in detail.

Figure 4:
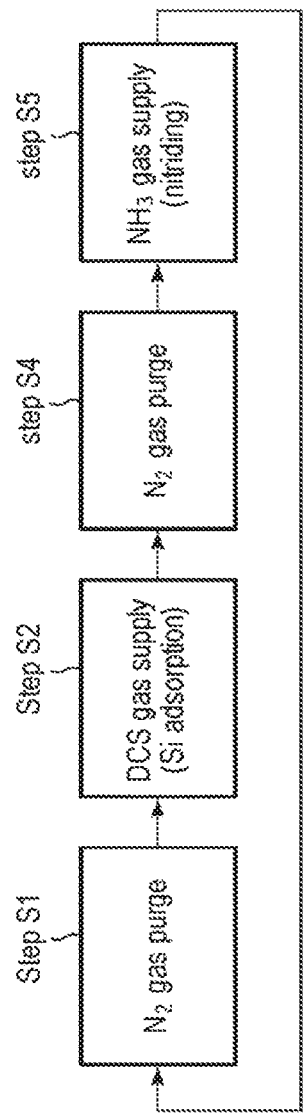
FIG. 4 is a diagram illustrating a sequence of a conventional nitride film forming method.

In the formation of the conventional ALD-SiN film, as illustrated in FIG. 4, the hydrogen radical step (step S3) is not performed and the purge step with an $N_2$ gas (step S1), the DCS gas supply step (step S2), the purge step with an $N_2$ gas (step S4), and the $NH_3$ gas supply (nitriding) step (step S5) are merely repeated.

Since the ALD-SiN film can be formed at a low temperature and with uniform and good coverage, it is used for an SiN spacer used for double patterning which requires very severe uniformity or the like according to miniaturization of a pattern. However, the SiN film generally has high tensile stress, and bending occurs due to the attraction between the spacers as the SiN spacer becomes thinner according to further miniaturization of the device.

Figure 5A:
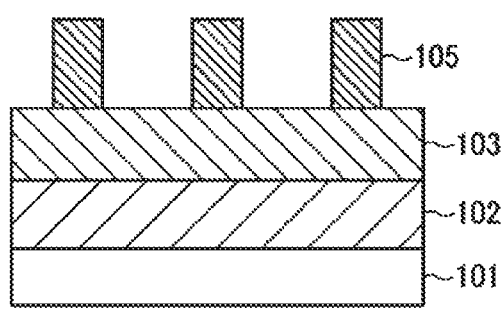
FIGS. 5A to 5D are diagrams illustrating double patterning using a silicon nitride film as a spacer.
Figure 5B:
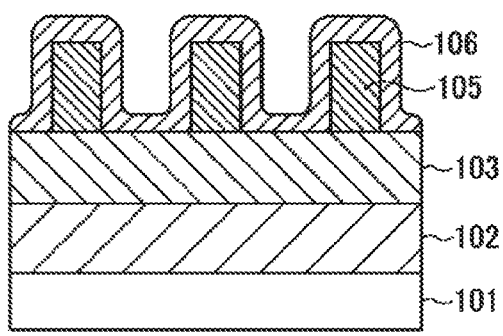
Figure 5C:
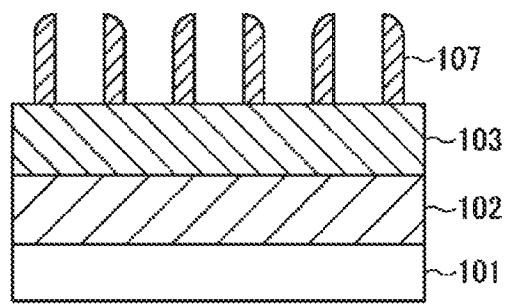
Figure 5D:
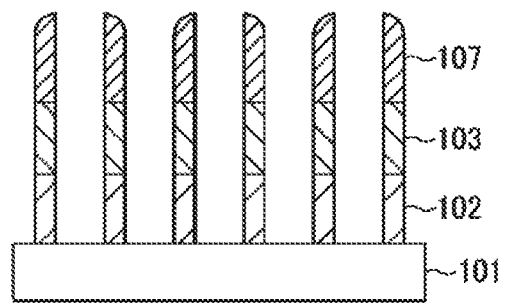
Figure 6:
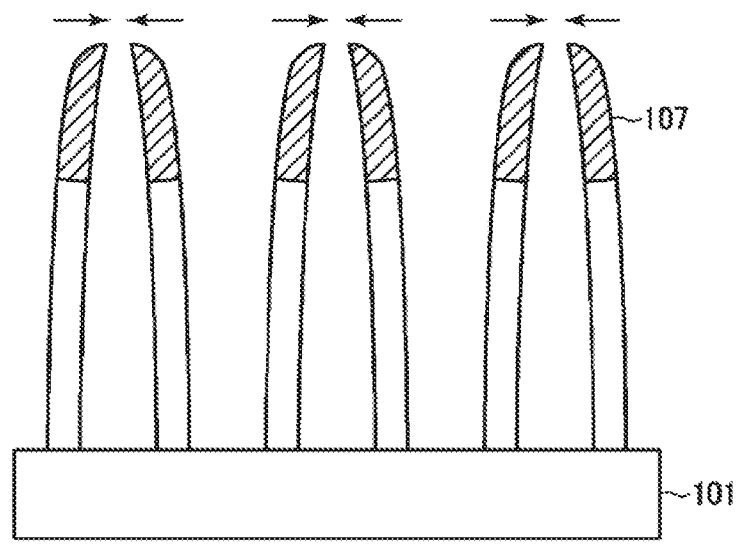
FIG. 6 is a view illustrating a state in which bending occurs due to stress of the silicon nitride film in the double patterning of FIGS. 5A to 5D.

That is, when a pattern is formed by double patterning, as illustrated in FIGS. 5A to 5D, a film to be etched 102 is formed on a silicon substrate 101, and a structure having a hard mask layer 103 and an amorphous silicon film 105 formed in a predetermined pattern is prepared thereon (FIG. 5A), an SiN film 106 is formed on the amorphous silicon film 105 (FIG. 5B), and an SiN spacer 107 remains by etching of the SiN film 106 and removal of the amorphous silicon film 105 (FIG. 5C). In this state, as illustrated in FIG. 5D, when etching is performed using the SiN spacer 107 as a mask, a thin pattern having the film to be etched 102, the hard mask layer 103, and the SiN spacer 107 remains and the spacers are attracted by the tensile stress of the SiN spacer 107, and thus, bending occurs as illustrated in FIG. 6.

Figure 7:
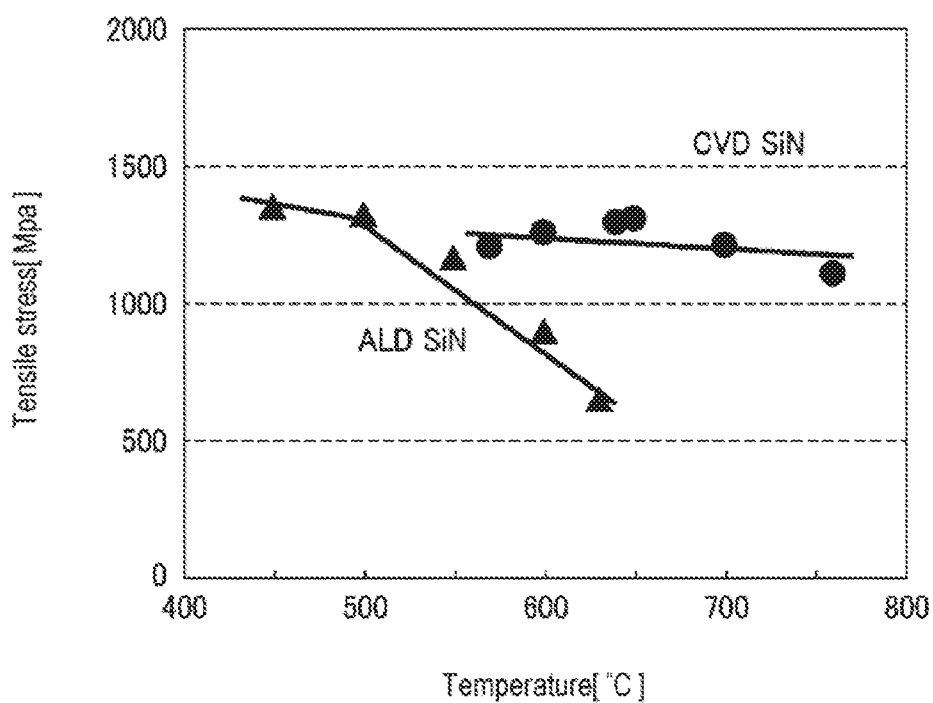
FIG. 7 is a diagram illustrating findings about stress of a conventional ALD-SiN film.

As illustrated in FIG. 7, conventionally, such stress in the film is decreased in the ALD-SiN film as the film-forming temperature increases, but in the film formation at a desired low temperature such as 400 to 500 degrees C., the stress is high. As illustrated in FIG. 7, the SiN film (PECVD-SiN film) by the plasma CVD method also exhibits high stress, but it can be reduced by adjusting the gas ratio or pressure. However, since the ALD-SiN film is very dense and has fewer impurities than those of the PECVD-SiN film, it is difficult to reduce the stress in the film at desired low temperature film formation.

Therefore, in the present embodiment, the stress in the film of the ALD-SiN film is reduced by the hydrogen radical purge step of step S3.

The mechanism of the hydrogen radical purge step of step S3 will be described with reference to FIGS. 8A and 8B.

In the formation of the conventional ALD-SiN film, as illustrated in FIG. 8A, when a DCS gas is supplied, an impurity such as Cl or H contained in DCS, or an excessive Si is physically adsorbed to chemically adsorbed Si in the form of clusters. In this state, an $NH_3$ gas is supplied. Therefore, SiN as formed contains the impurity such as Cl or H, or the excessive Si or the like and also contains pores, such that sufficient Si—N bonds are not formed. It became evident that this is the cause of the increasing tensile stress of the film.

Therefore, in the present embodiment, as illustrated in FIG. 8B, by performing a hydrogen radical purge, the impurity Cl or H and the excessive Si are removed as HCl, $SiH_4$, or the like. Thus, the monoatomic layer Si is almost adsorbed, and the $NH_3$ gas is supplied in this state. Therefore, the film contains fewer impurities, fewer pores, and sufficient Si—N bonds, thereby decreasing the tensile stress of the film.

Figure 9A:
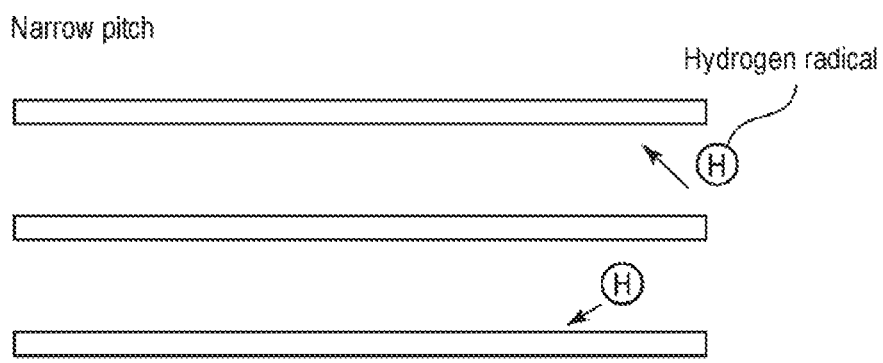
FIGS. 9A and 9B are diagrams illustrating a state of hydrogen radicals according to a pitch between wafers.
Figure 9B:
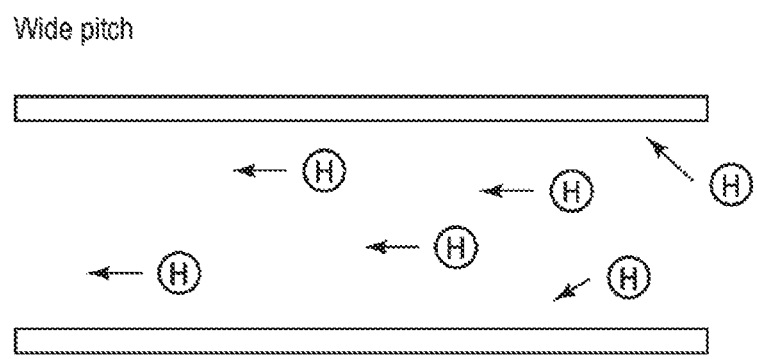

In order to sufficiently exhibit a stress reduction effect by the hydrogen radical purge, it is preferable that the pitch between the wafers mounted on the wafer boat 5 be wide. As illustrated in FIG. 9A, when the pitch between the wafers is narrow, hydrogen radicals tend to be deactivated, and there is a possibility that the hydrogen radicals do not reach the center of the wafers W. On the other hand, as illustrated in FIG. 9B, when the pitch between the wafers is wide, the hydrogen radicals are not deactivated and easily reach the center of the wafers W, allowing the hydrogen radicals to sufficiently act on the wafers W.

From this point of view, it is preferable that the pitch between the wafers be wider than the conventional 8 mm pitch, more preferably, 16 mm pitch or more. However, if the pitch is excessively widened, the number of processed sheets at a time decreases and the effect is also reduced. Therefore, a 32 mm pitch which is a quadruple pitch is optimum.

It is preferable that the ratio of the $H_2$ gas at the hydrogen radical purge step is as high as possible, and is preferably 50% or more. The $H_2$ gas may be 100%. It is preferable that the gas used together with the $H_2$ gas be an inert gas. The high frequency power is preferably 50 to 300 W, more preferably, 100 W or more, furthermore, 200 W. In addition, the $H_2$ gas flow rate is preferably 500 to 2.000 sccm, and the time period is preferably 10 to 60 sec.

As described above, the stress of the ALD-SiN film can be controlled according to the pitch of the wafers W and the conditions of the hydrogen radical purge step, and the desired low stress ALD-SiN film can be obtained by suitably setting the pitch of the wafers W and the conditions of the hydrogen radical purge step.

Experimental Example

Next, an experimental example of the present disclosure will be described.

Here, An SiN film was formed by repeating the aforementioned steps S1 to S5 by the apparatus illustrated in FIG. 1 while changing the wafer pitch and hydrogen radical purge conditions in a state that a DCS gas is used as a Cl-containing Si compound gas, an $NH_3$ gas is used as a nitriding gas, the temperature is 550 degrees C., the pressure is 400 Pa. Then, the stress of the obtained SiN film was measured.

The pitch between the wafers were set to 8 mm as a standard (indicated by ◆ in FIG. 10), 16 mm as a double pitch (indicated by ▲ in FIG. 10), and 32 mm as a quadruple pitch (indicated by □ in FIG. 10). The basic conditions of hydrogen radical purge were set as follows: the $H_2$ gas ratio: 50% ($H_2$ gas: 1,000 sccm, and $N_2$ gas: 1,000 sccm), and the high frequency power: 100 W, and the time period of hydrogen radical purge was changed.

The results are shown in FIG. 10. As shown in FIG. 10, if the hydrogen radical purge was not performed when the pitch between the wafers was 8 mm and 16 mm, the tensile stress of the SiN film was 1.200 MPa or more.

In the case of a 8 mm pitch, even when the hydrogen radical purge was performed for 20 sec, the tensile stress hardly decreased to 1,000 MPa or more. In the case of a 16 mm pitch, the tensile stress decreased to about 800 MPa at 20 sec of the hydrogen radical purge, and decreased to 600 MPa at 60 sec. In the case of a 32 mm pitch, it became 700 MPa or less at 20 sec, 600 MPa at 30 sec, and 500 MPa at 60 sec, obtaining a certain degree of stress reduction effect.

Therefore, in order to obtain a further stress reduction effect, in the pitch of 32 mm, the hydrogen radical purge of 60 sec was performed by changing the hydrogen radical purge conditions to the $H_2$ gas ratio: 80% (the $H_2$ gas: 1,000 sccm and the $N_2$ gas: 250 sccm), and the high frequency power: 200 W. The results are also shown in FIG. 10 (indicated by □ in FIG. 10). It was confirmed that by increasing the $H_2$ gas ratio and the high frequency power, the low tensile stress of 200 MPa or less was obtained.

Other Applications

While the embodiment of the present disclosure has been described above, the present disclosure is not limited to the aforementioned embodiment but may be differently modified without departing from the spirit of the present disclosure.

For example, in the aforementioned embodiment, there has been described an example in which the film forming method of the present disclosure is performed by a vertical batch-type apparatus. However, the present disclosure is not limited thereto and may also be performed by a horizontal batch-type apparatus.

Furthermore, in the aforementioned embodiment, there has been described an example in which plasma is generated by applying a high frequency power to a pair of plasma electrodes, and hydrogen radicals are generated by the plasma. However, the method of generating hydrogen radicals is not limited thereto and other plasma such as other inductively coupled plasma or microwave plasma may be used or a method such as a process of contacting a heating filament with a hydrogen gas or the like may be used.

According to the present disclosure in some embodiments, when a silicon nitride film is formed on a plurality of substrates to be processed in a batch by an ALD method, in each cycle, a hydrogen radical purge step of performing a hydrogen radical purge by generating hydrogen radicals in a process vessel is performed between a film-forming raw material adsorbing step and a nitriding step. Therefore, an Si—N bond of the silicon nitride film to be formed is promoted to reduce the tensile stress of the silicon nitride film to be formed. Thus, it is possible to obtain a silicon nitride film having a reduced stress by the ALD method.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a silicon nitride film, comprising:
arranging a plurality of target substrates in a process vessel; and
forming a silicon nitride film having a predetermined film thickness on the plurality of target substrates in a batch by repeating, a plurality of times, a cycle including:
a first purge step of purging an interior of the process vessel with an inert gas while heating the interior of the process vessel to a predetermined temperature and making the interior of the process vessel be in a predetermined depressurized state;
a film-forming raw material gas adsorbing step of adsorbing a chlorine-containing silicon compound to the target substrates by supplying a film-forming raw material gas composed of the chlorine-containing silicon compound into the process vessel;
a second purge step of purging the interior of the process vessel with an inert gas; and
a nitriding step of nitriding an element constituting the target substrates by supplying a nitriding gas into the process vessel,
wherein in each of the cycle, a hydrogen radical purge step of performing a hydrogen radical purge by generating hydrogen radicals in the process vessel is performed between the film-forming raw material gas adsorbing step and the nitriding step to promote an Si—N bond of the silicon nitride film to be formed so as to reduce a tensile stress of the silicon nitride film to be formed.

2. The method of claim 1, wherein a pitch between adjacent target substrates is 16 mm or more.

3. The method of claim 2, wherein the pitch between adjacent target substrates is 32 mm.

4. The method of claim 1, wherein in the nitriding step, active species of the nitriding gas are generated by plasma and the nitriding is performed by the active species.

5. The method of claim 1, wherein the hydrogen radical purge step is performed between the film-forming raw material gas adsorbing step and the second purge step.

6. The method of claim 1, wherein the hydrogen radical purge step is performed by setting a ratio of an $H_2$ gas in a supplied gas to 50% or more.

7. The method of claim 1, wherein in the hydrogen radical purge step, the hydrogen radicals are generated by plasmarizing a hydrogen gas.

8. The method of claim 7, wherein in the hydrogen radical purge step, when plasmarizing the hydrogen gas, a high frequency power is 100 W or more.

9. The method of claim 1, wherein a time period of the hydrogen radical purge step is 10 to 60 seconds.

10. The method of claim 1, wherein the chlorine-containing silicon compound is at least one selected from a group consisting of dichlorosilane, monochlorosilane, trichlorosilane, silicon tetrachloride, and hexachlorodisilane.

11. The method of claim 1, wherein the nitriding gas is at least one selected from a group consisting of an $NH_3$ gas and an $N_2$ gas.

12. A film forming apparatus for forming a silicon nitride film having a predetermined film thickness on a plurality of target substrates in a batch, comprising:
a process vessel configured to accommodate the plurality of target substrates on which the silicon nitride film is formed;
a gas supply mechanism configured to supply an inert gas, a silicon film-forming raw material gas, a nitriding gas, and a hydrogen gas into the process vessel;
a heating device configured to heat the plurality of target substrates accommodated in the process vessel;
a hydrogen radical generating mechanism configured to generate hydrogen radicals;
an exhaust device configured to exhaust an interior of the process vessel; and
a controller configured to control so that the silicon nitride film having a predetermined film thickness is formed on the plurality of target substrates in a batch by repeating, a plurality of times, a cycle including:
a first purge step of purging the interior of the process vessel with an inert gas while heating the interior of the process vessel to a predetermined temperature and making the interior of the process vessel be in a predetermined depressurized state;
a film-forming raw material gas adsorbing step of adsorbing a chlorine-containing silicon compound to the target substrates by supplying a film-forming raw material gas composed of the chlorine-containing silicon compound into the process vessel;
a second purge step of purging the interior of the process vessel with an inert gas; and
a nitriding step of nitriding an element constituting the target substrates by supplying a nitriding gas into the process vessel,
wherein, in each of the cycle, a hydrogen radical purge step of performing a hydrogen radical purge by generating hydrogen radicals in the process vessel by the hydrogen radical generating mechanism is performed between the film-forming raw material gas adsorbing step and the nitriding step to promote an Si—N bond of the silicon nitride film to be formed so as to reduce a tensile stress of the silicon nitride film to be formed.

13. A non-transitory computer-readable storage medium storing a program that operates on a computer and controls an apparatus for forming a silicon nitride film, wherein the program, when executed, causes the computer to control the apparatus for forming a silicon nitride film to perform the method of forming a silicon nitride film of claim 1.

* * * * *